United States Patent
Matthies et al.

(10) Patent No.: US 6,527,159 B2
(45) Date of Patent: Mar. 4, 2003

(54) SURFACE MOUNTING TO AN IRREGULAR SURFACE

(75) Inventors: Dennis L. Matthies, Princeton, NJ (US); Ponnusamy Palanisamy, Lansdale, PA (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 09/904,335

(22) Filed: Jul. 12, 2001

(65) Prior Publication Data

US 2003/0010807 A1 Jan. 16, 2003

(51) Int. Cl.⁷ .............................................. H01L 23/538
(52) U.S. Cl. .................................... 228/103; 257/737
(58) Field of Search ........................ 228/180.22, 180.1, 228/180.5, 254, 103; 257/738, 737; 174/263; 438/612, 613, 614, 615

(56) References Cited

U.S. PATENT DOCUMENTS

| | | | |
|---|---|---|---|
| 5,118,584 A | * 6/1992 | Evans et al. | 216/103 |
| 5,435,482 A | * 7/1995 | Variot et al. | 228/106 |
| 5,461,261 A | * 10/1995 | Nishiguchi | 257/737 |
| 5,465,152 A | * 11/1995 | Bilodeau et al. | 356/237.1 |
| 5,747,102 A | * 5/1998 | Smith et al. | 222/1 |
| 5,828,128 A | * 10/1998 | Higashiguchi et al. | 257/737 |
| 5,894,984 A | * 4/1999 | Sakai et al. | 228/180.22 |
| 6,119,925 A | * 9/2000 | Lin et al. | 228/180.22 |
| 6,234,373 B1 | * 5/2001 | Wark | 228/141.1 |
| 6,271,109 B1 | * 8/2001 | Weygan et al. | 438/612 |

* cited by examiner

Primary Examiner—Tom Dunn
Assistant Examiner—Jonathan Johnson
(74) Attorney, Agent, or Firm—Trop, Pruner & Hu, P.C.

(57) ABSTRACT

Surface mount technology may be utilized to join two surfaces together that may include relative surface irregularities. By varying the volume of surface mount material applied to electrically and physically join the two surfaces, surface-to-surface irregularities may be compensated for. Various techniques may be utilized to vary the volume of the interconnection material in a high speed fashion.

5 Claims, 2 Drawing Sheets

SURFACE MOUNTING TO AN IRREGULAR SURFACE

BACKGROUND

This invention relates generally to surface mounting technology utilized to electrically and physically interconnect electronic components.

In surface mount technology (SMT), two surfaces may be electrically interconnected using solder bumps or balls that are deposited upon one of the surfaces and then reflowed or heated to solder the two surfaces together. SMT may be an advantageous process because it is not necessary to work in the region between the two surfaces to be joined and because a large number of components may be connected in the same reflow step.

A problem may arise, however, when one of the surfaces to be bonded is irregular. For example, one surface to be surface mounted to another surface may be warped. When the surface mount bumps of uniform size are deposited, an open or poor connection may result. Conversely, if the warp of one surface extends toward the other, solder balls in the intervening area may be excessively deformed causing them to squeeze out and short other electrical components.

Referring to FIG. 6, a first relatively flat substrate 10 may be surface mounted to an irregular substrate 12. In this case, the substrate 12 is warped for illustration purposes. The solder bumps or balls 14 may be applied to the flat surface 12. However, when the two surfaces 10 and 12 are brought together, some of the solder balls may not make effective contact with the surface 12 because of its curvature, while other balls may be excessively deformed raising the possibility of shorts to adjacent components.

Thus, there is a need for a way to deal with the possibility that the spacing between two surfaces to be surface mounted may not be uniform and regular throughout.

DETAILED DESCRIPTION

Figure 1:
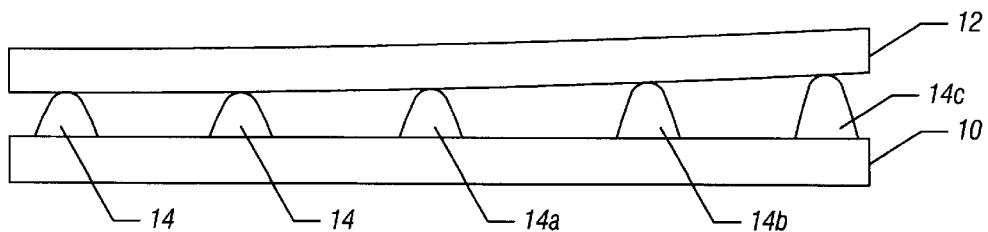
FIG. 1 is a side elevational view of one embodiment of the present invention.

Referring to FIG. 1, the surface mounted substrates 10 and 12 are well joined despite the fact that the surface 12 is irregular. For example, substrate 12 is illustrated as having a warp which causes it to warp away from the substrate 10 near the right side in FIG. 1. By making the solder bumps 14 of substantially equal volume on the left side because of the substantially uniform spacing therein and progressively increasing the volume of the solder bumps 14a, 14b and 14c, the irregularity between the two substrates 10 and 12 can be compensated for by the surface mounting technique.

A variety of different techniques may be utilized to apply different volumes of material for forming the solder bumps 14 of programmably variable volume. For example, conventional printing and needle dispensing techniques utilized for applying solder bumps may be utilized. However, with conventional technology, great pains are taken to ensure that equal amounts of solder are applied to form each solder bump. In connection with embodiments of the present invention, the same technology may be utilized to dispense variable amounts of solder bumps deliberately to account for bonded surface irregularities.

Figure 2:
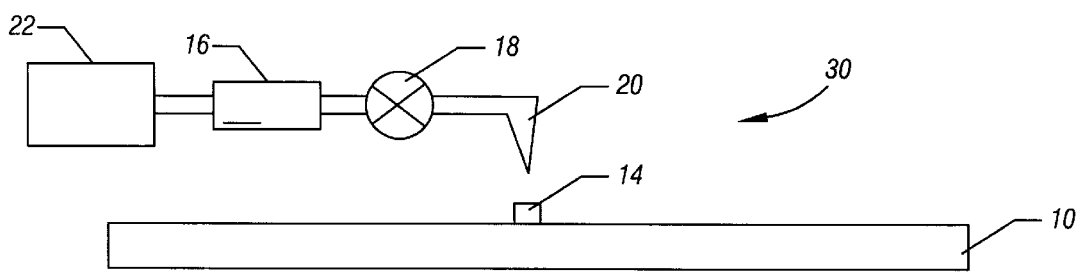
FIG. 2 is a side elevational view of an embodiment using a glue dispensing apparatus.

Referring to FIG. 2, a glue dispensing machine 30 may dispense the bumps 14 at a very high rate of speed. A reservoir 22 contains the material to be deposited which may be solder or other conductive adhesive. Examples of materials utilized for making bumps may include solder, solder paste, conductive epoxy, and isotropic conductive materials. Material in the reservoir 22 is pumped by the pump 16 through a valve 18 and ultimately through a dispensing needle or nozzle 20 to be dispensed on the substrate 10, forming the solder bumps 14. By programmably controlling the aperture of the needle 20, in one embodiment, the volume of material that is deposited to form the bumps 14 may be programmably adjusted.

In one embodiment, a variety of measuring techniques may be used to determine the surface profile of the substrates 10 and 12. Flatness of a substrate 10 or 12 may be measured using various mechanical and optical profilometers. Measurement of nonflatness of a substrate 10 or 12 may also be accomplished by scanning a mechanical feeler gauge over the substrate 10 or 12 surface or by using a linear or area array of gauges. Alternatively, optical techniques may be utilized, such as looking at the off-axis image of a grating that can be used to determine the flatness profile. Ultrasonic profile measurement devices may be used as well, as still another example.

Once the substrate 10 and/or 12 profile is known, the thickness of any particular bump 14 may be calculated. The bump 14 volume may then be programmed into the bump 14 forming apparatus.

Figure 3:
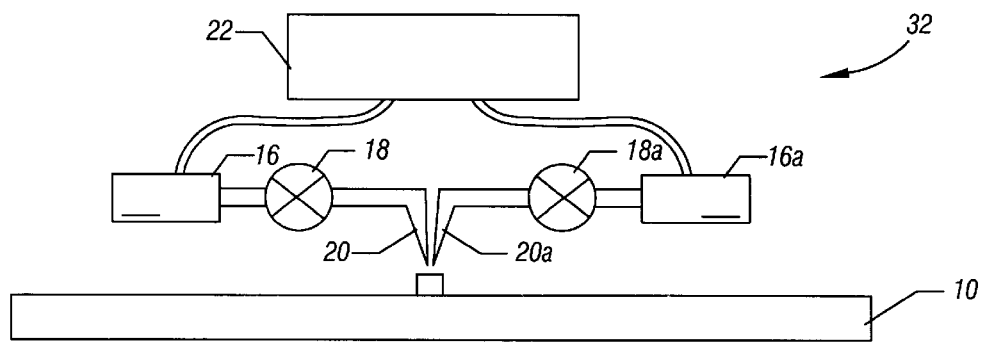
FIG. 3 is a side elevational view of another embodiment in accordance with the present invention.
Figure 6:
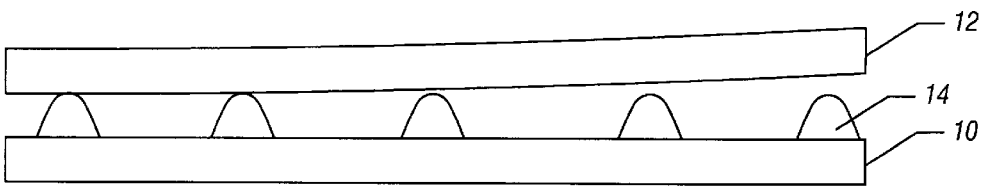
FIG. 6 illustrates the problem that may arise with the prior art.

Referring to FIG. 3, the variable bump 14 volume may be achieved using a multiple deposition apparatus 32 in another embodiment. In one embodiment, the two dispensing needles 20 and 20a may work in tandem. For example, a perfect pair of substrates may utilize only the needle 20 in one embodiment. When variable bump volumes are needed, both needles 20 and 20a may be utilized. Similarly, when less volume is needed, the needle 20a may be utilized. As still another alternative, both needles 20 and 20a may work in parallel to apply the desired amount of material at the highest possible rate. Any number of additional nozzles 20 may be utilized as well.

As before, each nozzle 20 or 20a may be connected to a valve 18 or 18a, a pump 16 or 16a and ultimately to a reservoir 22 of dispensed material. The composite formed by depositing dots from two different sources may result in a solder ball that is not materially different than other solder balls except for the amount of the volume applied, in one example.

Figure 4:
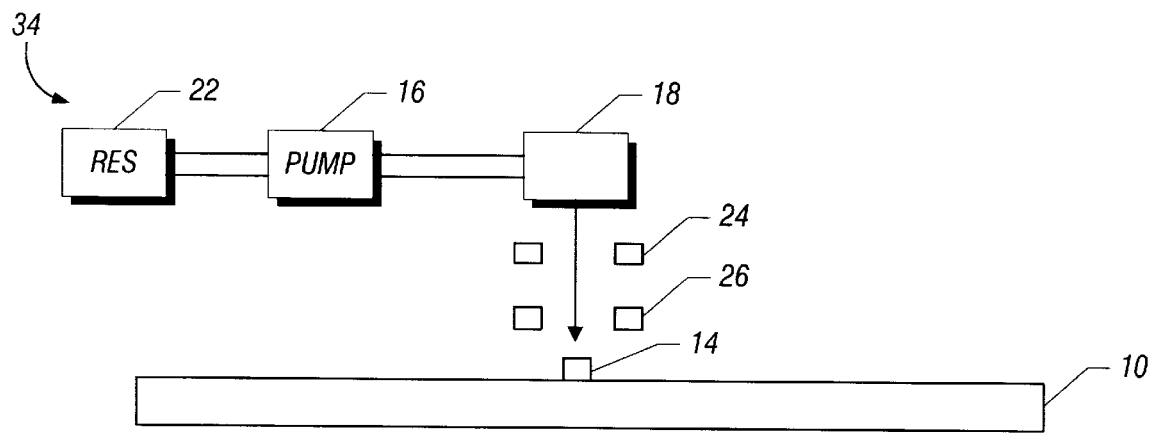
FIG. 4 is a side elevational view of still another embodiment of the present invention.

Referring next to FIG. 4, an ink jet system may be utilized to deposit the solder bumps, in another embodiment. Use of ink jet equipment to deposit solder is well known. Some ink jet or microjet printers are capable of printing various solder compositions. In general, a microjet printer 34 includes a reservoir 22 storing the liquid material, a pump 16, and a transducer 18 that breaks up the liquid stream into droplets. A charging electrode 24 applies a charge to each droplet and an electrostatic field is applied by electrodes 26 to deflect the droplet to its precise location on the substrate 10.

The ink jet technique can produce liquid droplets on the order of 20 to 150 microns in diameter, at a frequency of 1,000 per second, in an on-demand stop and go mode, and at a frequency of up to 20,000 droplets per second in continuous mode. The capability has been demonstrated for 70 micrometer droplets of molten Sn63 solder at a deposition rate of 600 droplets per second. Higher rates may be achieved with multiple ink jet devices. One such ink jet printer suitable for this application is a Microjet by Microtab Technologies, Inc., Plano, Tex. 75074, for the Jetlab Printing Platform.

The required volume of solder deposited at a given location can be achieved by simply programming the printer 34 (or multiple printers on the same manufacturing line to increase throughput). The technique to handle random variations in substrate camber is well suited for depositing liquid or low viscosity paste materials on substrates that require low to high density of contacts.

Figure 5:
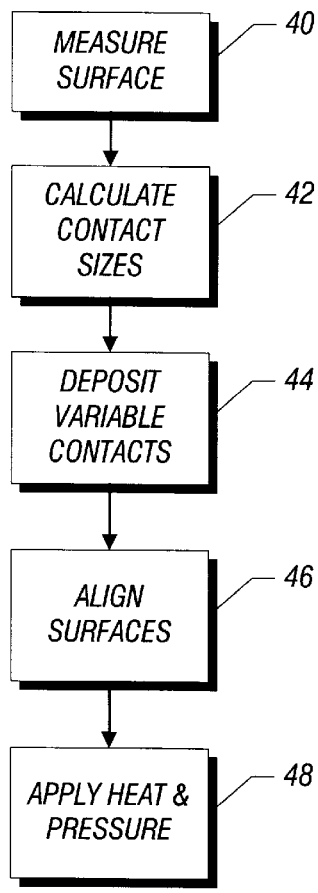
FIG. 5 is a flow in accordance with one embodiment of the present invention.

Referring FIG. 5, initially the surface irregularity is measured as indicated at block 40. Once the surface irregularity has been determined, the necessary contact size may be calculated as indicated in block 42. This may be implemented using automated processes in some embodiments. The variable contacts may then be deposited using a variety of different techniques as indicated in block 44.

Thereafter, the substrate 10 and 12 surfaces may be aligned as indicated in block 46. Pressure and/or heat may then be applied to the surfaces of the substrates 10 and 12 to implement surface mounting as indicated in block 48.

Following deposition of the solder material, it may be desirable to do additional processing before forming contacts. For example, it may be desirable to do a reflow process to form or reform solder bumps 14. Alternatively, it may be desirable to add a flux or cleaning agent.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An electronic device comprising:

a first surface;

a second surface;

an irregularity in at least one of the first and second surfaces; and solder bumps bonding said first surface to said second surface, said solder bumps including a greater amount of solder material where there is a greater distance between said surfaces to accommodate for the irregularity in at least one of said first and second surfaces.

2. The device of claim 1 wherein the device is a display module.

3. The device of claim 2 wherein said display is an organic light emitting device display.

4. The device of claim 1 wherein said first surface is formed of a ceramic layer and said second surface is formed of a glass panel.

5. The device of claim 1 wherein said first and second surfaces are surface mounted to one another.

* * * * *